(12) United States Patent
Benson

(10) Patent No.: US 8,192,555 B2
(45) Date of Patent: Jun. 5, 2012

(54) NON-CHEMICAL, NON-OPTICAL EDGE BEAD REMOVAL PROCESS

(75) Inventor: Peter A. Benson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 568 days.

(21) Appl. No.: 10/335,279

(22) Filed: Dec. 31, 2002

(65) Prior Publication Data

US 2004/0126923 A1 Jul. 1, 2004

(51) Int. Cl.
*B08B 3/00* (2006.01)
*B08B 7/00* (2006.01)

(52) U.S. Cl. ............................. 134/37; 134/32; 134/34
(58) Field of Classification Search .................. 134/6, 7, 134/34, 37, 32
See application file for complete search history.

(56) References Cited

U.S. PATENT DOCUMENTS

| | | | |
|---|---|---|---|
| 4,775,883 A * | 10/1988 | Borchert et al. ............... 257/168 |
| 4,806,171 A | 2/1989 | Whitlock et al. ................... 134/7 |
| 5,062,898 A | 11/1991 | McDermott et al. ............... 134/7 |
| 5,145,717 A * | 9/1992 | Drury ........................... 430/314 |
| 5,294,261 A * | 3/1994 | McDermott et al. ............... 134/7 |
| 5,349,978 A * | 9/1994 | Sago et al. ..................... 134/153 |
| 5,372,652 A * | 12/1994 | Srikrishnan et al. ............... 134/7 |
| 5,398,372 A * | 3/1995 | Kush ............................. 15/309.1 |
| 5,431,332 A | 7/1995 | Kirby et al. ..................... 228/246 |
| 5,512,106 A | 4/1996 | Tamai et al. ...................... 134/7 |
| 5,567,655 A | 10/1996 | Rostoker et al. ................ 437/209 |
| 5,608,943 A * | 3/1997 | Konishi et al. ................... 15/302 |
| 5,618,380 A | 4/1997 | Siems et al. ...................... 438/14 |
| 5,667,928 A * | 9/1997 | Thomas et al. ................. 430/134 |
| 5,792,275 A * | 8/1998 | Natzle et al. ....................... 134/7 |
| 5,810,942 A | 9/1998 | Narayanswami et al. ......... 134/7 |
| 5,853,962 A | 12/1998 | Bowers ........................... 430/331 |
| 5,904,164 A * | 5/1999 | Wagner et al. ................. 134/148 |
| 5,931,721 A | 8/1999 | Rose et al. ........................ 451/89 |
| 5,939,139 A * | 8/1999 | Fujimoto ....................... 427/240 |
| 5,952,050 A | 9/1999 | Doan ............................. 427/336 |
| 6,062,084 A * | 5/2000 | Chang et al. ..................... 73/601 |
| 6,063,439 A | 5/2000 | Semba et al. .................. 427/240 |
| 6,105,589 A * | 8/2000 | Vane ............................... 134/1.1 |
| 6,117,486 A | 9/2000 | Yoshihara ..................... 427/240 |
| 6,140,287 A * | 10/2000 | Lee ................................ 510/175 |
| 6,202,658 B1 * | 3/2001 | Fishkin et al. ................. 134/147 |
| 6,255,228 B1 | 7/2001 | Rolfson ......................... 438/758 |

(Continued)

FOREIGN PATENT DOCUMENTS

EP 0712692 * 5/1966

(Continued)

OTHER PUBLICATIONS

Merriam-Webster's Collegiate Dictionary, Tenth edition. 1999. p. 366.*

*Primary Examiner* — Michael Kornakov
*Assistant Examiner* — Nicole Blan
(74) *Attorney, Agent, or Firm* — Whyte Hirschboeck Dudek SC

(57) ABSTRACT

A method for removing the edge bead from a substrate by applying an impinging stream of a medium that is not a solvent for the material to be removed. The medium is applied to the periphery of the substrate with sufficient force to remove the material. Also an apparatus to perform the inventive method.

19 Claims, 1 Drawing Sheet

U.S. PATENT DOCUMENTS

| | | | |
|---|---|---|---|
| 6,258,688 B1 * | 7/2001 | Tsai | 438/381 |
| 6,261,427 B1 | 7/2001 | Rolfson | 204/224 M |
| 6,267,817 B1 | 7/2001 | Gonzalez | 117/92 |
| 6,282,812 B1 | 9/2001 | Wee et al. | 34/464 |
| 6,284,676 B1 | 9/2001 | Whitman | 438/782 |
| 6,322,954 B1 | 11/2001 | Li | 430/313 |
| 6,399,412 B1 * | 6/2002 | Asai et al. | 438/63 |
| 6,412,326 B1 | 7/2002 | Hubbard et al. | 73/1.01 |
| 6,436,851 B1 * | 8/2002 | Young et al. | 438/782 |
| 6,449,873 B1 * | 9/2002 | Yoon et al. | 34/448 |
| 6,453,916 B1 * | 9/2002 | Tran et al. | 134/58 R |
| 6,565,920 B1 * | 5/2003 | Endisch | 427/240 |
| 6,612,319 B1 * | 9/2003 | Rangarajan et al. | 134/104.1 |
| 6,837,967 B1 * | 1/2005 | Berman et al. | 156/345.3 |
| 2002/0033381 A1 * | 3/2002 | Nakabayashi et al. | 216/46 |
| 2003/0073309 A1 * | 4/2003 | Emami | 438/689 |
| 2003/0077984 A1 * | 4/2003 | Smith et al. | 451/38 |

FOREIGN PATENT DOCUMENTS

| | | | |
|---|---|---|---|
| JP | 2000-138187 | * | 5/2000 |
| WO | WO01/94037 | * | 12/2001 |

* cited by examiner

NON-CHEMICAL, NON-OPTICAL EDGE BEAD REMOVAL PROCESS

BACKGROUND OF THE INVENTION

The invention relates generally to the manufacture of semiconductor devices. More particularly, the invention relates to a non-solvent system for semiconductor wafer processes such as removing the edge bead formed during spin coating processes.

Coating materials such as photoresist are typically applied to a semiconductor wafer by flowing liquid coating material onto the top surface of the wafer while it is spinning. The wafer is held on a disk shaped, rotating spin chuck. The diameter of the chuck is slightly less than the diameter of the wafer. The chuck is positioned so that the wafer lies on the chuck in a level horizontal plane. In operation, the backside or inactive surface of the wafer is placed onto the chuck. The chuck applies a suction to the backside of the wafer to hold the wafer in place on the chuck. The chuck is rotated by a motor driven axle that extends down from the chuck. As the wafer is rotated on the chuck, liquid photoresist material is applied to the center of the wafer. The photoresist spreads radially outward from the center of the wafer towards the edge to coat the top of the wafer. Ideally, all excess coating material is ejected from the edge of the wafer. In practice, however, some excess photoresist tends to collect at and form a bead along the edge of the wafer.

Processes to remove the edge bead are known. Typically, a solvent is dispensed along the edge of the wafer to dissolve the edge bead and remove the resist from the extreme edge of the wafer. If necessary, the coating is exposed to light prior to contact with the solvent, or developer in order to develop the coating and render it soluble in the solvent. The solvent may be dispensed through a nozzle directed toward the backside edge of the wafer, in which case it wicks up around to the top of the wafer to dissolve the edge bead, or the solvent may be dispensed directly onto the top edge of the wafer. In either case, the process allows solvent and dissolved photoresist to be splashed about and often leaves a jagged edge profile on the photoresist or other coating material. In the process of U.S. Pat. No. 5,952,050, the method includes the steps of dispensing a solvent selectively onto the edge of the wafer to dissolve the coating material at the extreme edge of the wafer, and applying a suction to vacuum excess solvent and dissolved coating material from the wafer.

BRIEF SUMMARY OF THE INVENTION

The current invention is an edge bead removal method which does not require the use of solvents or optical processing. In one preferred embodiment, the invention is a method comprising the steps of providing a substrate having an outer edge wherein at least one material forms a coating layer on the outer edge of the substrate; and removing material from the coating layer by impinging the coated outer edge with a stream of a medium which is not a solvent for the material.

In another preferred embodiment, an edge bead removal method, the method comprising the steps of providing a substrate having an outer edge wherein at least one material forms a coating layer on the outer edge of the substrate and removing material from the coating layer by impinging the coated outer edge with a stream of a medium which is not a solvent for the material.

In yet another preferred embodiment, an edge bead removal method, the method comprising the steps of providing a substrate having an outer edge wherein at least one material forms a coating layer on the outer edge of the substrate and removing material from the coating layer by impinging the coated outer edge with a stream of a gas which is not a solvent for the material.

In a further preferred embodiment, the invention is an edge bead removal method, the method comprising the steps of providing a substrate having an outer edge wherein at least one material forms a coating layer on the outer edge of the substrate and removing material from the coating layer by impinging the coated outer edge with a stream of an aerosol which is not a solvent for the material.

In another preferred embodiment, the invention is an edge bead removal method, the method comprising the steps of providing a substrate having an outer edge and an underside, wherein at least one material forms a coating layer on the outer edge of the substrate; removing material from the coating layer by impinging the coated outer edge with a stream of a medium which is not a solvent for the material; and applying a cleaning solution to the outer edge or underside of the substrate to remove from the periphery any residue remaining after the removal step.

Another preferred embodiment of the invention is an edge bead removal method, the method comprising the steps of providing a substrate having an outer edge and an underside, wherein at least one material forms a coating layer on the outer edge of the substrate; removing material from the coating layer by impinging the coated outer edge with a stream of a gas which is not a solvent for the material; and applying a cleaning solution to the outer edge or underside of the substrate to remove from the periphery any residue remaining after the removal step.

A further preferred embodiment of the invention is an edge bead removal method, the method comprising the steps of providing a substrate having an outer edge and an underside, wherein at least one material forms a coating layer on the outer edge of the substrate; removing material from the coating layer by impinging the coated outer edge with a stream of an aerosol which is not a solvent for the material; and applying a cleaning solution to the outer edge or underside of the substrate to remove from the periphery any residue remaining after the removal step.

Another preferred embodiment of the invention is an edge bead removal method, the method comprising the steps of providing a substrate having an outer edge wherein at least one material forms a coating layer on the outer edge of the substrate; forming a directed stream of a non-dissolving medium; and aiming the stream of a non-dissolving medium to impinge the coated outer edge thereby removing material from the coating layer.

Yet another preferred embodiment of the invention is an edge bead removal method, the method comprising the steps of providing a substrate having an outer edge wherein at least one material forms a coating layer on the outer edge of the substrate; forming a directed stream of a non-dissolving gas; and aiming the stream of a non-dissolving medium to impinge the coated outer edge thereby removing material from the coating layer.

Another preferred embodiment of the invention is an edge bead removal method, the method comprising the steps of providing a substrate having an outer edge wherein at least one material forms a coating layer on the outer edge of the substrate; forming a directed stream of a non-dissolving aerosol; and aiming the stream of a non-dissolving medium to impinge the coated outer edge thereby removing material from the coating layer.

In a further preferred embodiment, the invention is an edge bead removal method, the method comprising the steps of providing a substrate having an outer edge wherein at least one material forms a coating layer on the outer edge of the substrate; forming a directed stream of a non-dissolving medium; aiming the stream of a non-dissolving medium to impinge the coated outer edge thereby removing material from the coating layer; and applying a cleaning solution to the periphery or underside of the substrate to remove from the periphery any residue remaining after the removal step.

In yet a further preferred embodiment, the invention is an edge bead removal method, the method comprising the steps of providing a substrate having an outer edge wherein at least one material forms a coating layer on the outer edge of the substrate; forming a directed stream of a non-dissolving gas; aiming the stream of a non-dissolving gas to impinge the coated outer edge thereby removing material from the coating layer; and applying a cleaning solution to the periphery or underside of the substrate to remove from the periphery any residue remaining after the removal step.

In another preferred embodiment, the invention is an edge bead removal method, the method comprising the steps of providing a substrate having an outer edge wherein at least one material forms a coating layer on the outer edge of the substrate; forming a directed stream of a non-dissolving aerosol; aiming the stream of a non-dissolving aerosol to impinge the coated outer edge thereby removing material from the coating layer; and applying a cleaning solution to the periphery or underside of the substrate to remove from the periphery any residue remaining after the removal step.

In a further preferred embodiment, the invention is an edge bead removal method, the method comprising the steps of providing a substrate having an outer edge wherein at least one material forms a coating layer on the outer edge of the substrate; providing means for forming a directed stream of a non-dissolving medium; forming a directed stream of a non-dissolving medium; aiming the stream of a non-dissolving medium to impinge the coated outer edge thereby removing material from the coating layer; and applying a cleaning solution to the periphery or underside of the substrate to remove from the periphery any residue remaining after the removal step.

In yet another preferred embodiment, the invention is an edge bead removal method, the method comprising the steps of providing a substrate having an outer edge wherein at least one material forms a coating layer on the outer edge of the substrate; providing means for forming a directed stream of a non-dissolving medium; forming a directed stream of a non-dissolving gas; aiming the stream of a non-dissolving gas to impinge the coated outer edge thereby removing material from the coating layer; and applying a cleaning solution to the periphery or underside of the substrate to remove from the periphery any residue remaining after the removal step.

In another preferred embodiment, the invention is an edge bead removal method, the method comprising the steps of providing a substrate having an outer edge wherein at least one material forms a coating layer on the outer edge of the substrate; providing means for forming a directed stream of a non-dissolving medium; forming a directed stream of a non-dissolving aerosol with the stream forming means; aiming the stream of a non-dissolving aerosol to impinge the coated outer edge thereby removing material from the coating layer; and applying a cleaning solution to the periphery or underside of the substrate to remove from the periphery any residue remaining after the removal step.

In another preferred embodiment, the invention is an edge bead removal method, the method comprising the steps of providing a substrate having an outer edge wherein at least one material forms a coating layer on the outer edge of the substrate; providing an air knife or nozzle aimed at the outer edge of the substrate; forming a directed stream of a non-dissolving medium; aiming the stream of a non-dissolving medium to impinge the coated outer edge thereby removing material from the coating layer; and applying a cleaning solution to the periphery or underside of the substrate to remove from the periphery any residue remaining after the removal step.

In another preferred embodiment, the invention is an edge bead removal method, the method comprising the steps of providing a substrate having an outer edge wherein at least one material forms a coating layer on the outer edge of the substrate; providing an air knife or nozzle aimed at the outer edge of the substrate; forming a directed stream of a non-dissolving gas; aiming the stream of a non-dissolving gas to impinge the coated outer edge thereby removing material from the coating layer; and applying a cleaning solution to the periphery or underside of the substrate to remove from the periphery any residue remaining after the removal step.

Another preferred embodiment of the invention is an edge bead removal method, the method comprising the steps of providing a substrate having an outer edge wherein at least one material forms a coating layer on the outer edge of the substrate; providing an air knife or nozzle aimed at the outer edge of the substrate; forming a directed stream of a non-dissolving aerosol; aiming the stream of a non-dissolving aerosol to impinge the coated outer edge thereby removing material from the coating layer; and applying a cleaning solution to the periphery or underside of the substrate to remove from the periphery any residue remaining after the removal step.

In still another preferred embodiment, the invention is a method for the manufacture of a semi-conductive wafer, comprising the steps of applying a coating material to a top surface of the semi-conductive wafer and spinning the wafer to form a film of coating material on the top surface of the wafer; and contacting the periphery of the coated spinning wafer with an impinging stream of non-dissolving medium.

In yet another preferred embodiment, the invention is a method for the manufacture of a semi-conductive wafer, comprising the steps of applying a coating material to a top surface of the semi-conductive wafer and spinning the wafer to form a film of coating material on the top surface of the wafer; contacting the periphery of the coated spinning wafer with an impinging stream of non-dissolving medium; and applying a cleaning solution to the periphery of the spinning wafer, the cleaning solution formulated to react chemically with coated material to form a contaminant compound that can be ejected from a spinning wafer.

BRIEF DESCRIPTION OF THE DRAWINGS

Preferred embodiments of the invention are described below with reference to the following accompanying drawings, which are for illustrative purposes only. Throughout the following views, reference numerals will be used in the drawings, and the same reference numerals will be used throughout the several views and in the description to indicate same or like parts.

DETAILED DESCRIPTION OF THE INVENTION

In the following detailed description, references made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, chemical and process changes may be made without departing from the spirit and scope of the present invention.

The terms "wafer" or "substrate" used in the following description include any semiconductor-based structure having a silicon surface. Wafer and substrate are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when references made to a wafer or substrate in the following description, previous process steps may have been used to form regions or junctions in the base semiconductor structure or foundation.

The current invention uses a stream of a non-dissolving medium to remove the edge bead from a substrate. The term "non-dissolving medium" is equivalent to the term "nonsolvent" and is used to designate that the material of the edge bead is substantially insoluble in the medium. The edge bead is typically formed when a coating, such as a photoresist, is applied to a substrate. The edge bead frequently has an undesired thickness or quality compared to the rest of the coating. Optionally, the inventive process also includes wet cleaning to remove residual particles remaining after the edge bead has been removed.

Figure 1:
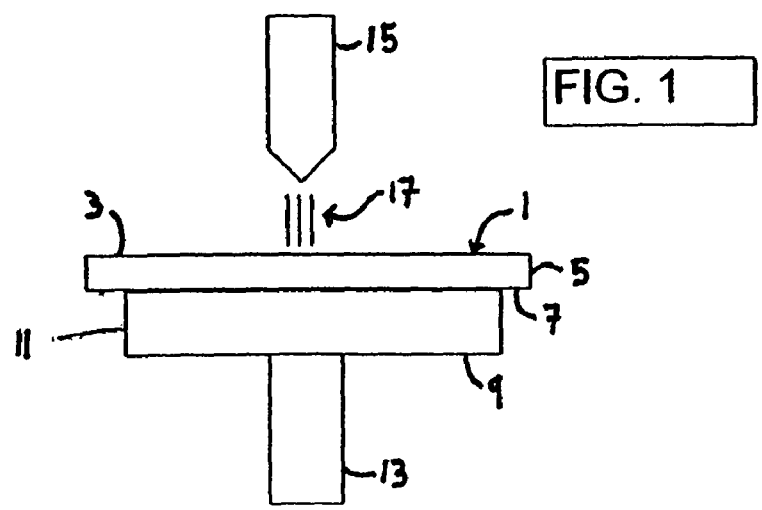
FIG. 1 shows a side schematic view of a process step for applying a coating onto a substrate.
Figure 2:
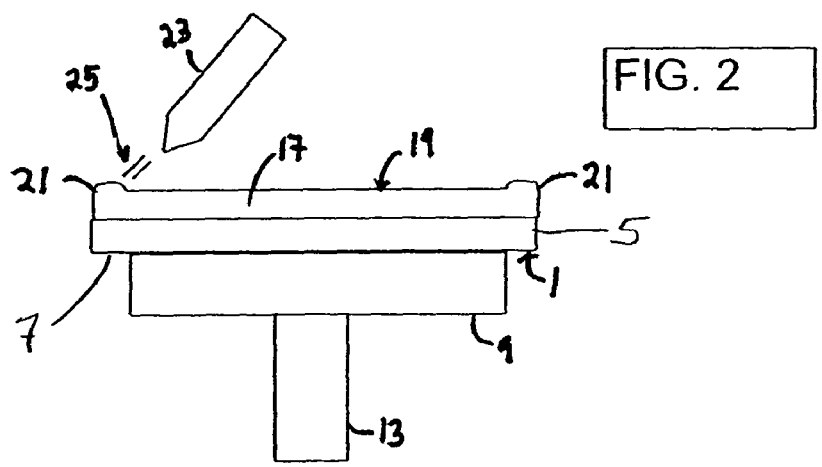
FIG. 2 shows a side view of a process step for removing the edge bead.

The substrate with the edge bead may be prepared as shown in FIG. 1. In the illustration of FIG. 1, the substrate is a wafer 1. Wafer 1 has a top surface 3 and outer edge 5 and a bottom surface 7. Wafer 1 is mounted on a vacuum chuck 9 which in turn is attached to a spindle 13. Typically, the outer edge 11 of mounting chuck 9 does not extend to the outer edge 5 of wafer 1. Rotation of spindle 13 causes vacuum mount 9 and wafer 1 mounted thereto to spin also. While mounted wafer 1 is either stationary or rotating at a slow speed, an application nozzle 15 applies coating material 17 to the center of wafer 1. The mounted wafer 1 is then rapidly accelerated to a high rotational speed. The centrifugal force of the rotation causes coating material 17 to spread across the entire upper surface 3 of wafer 1. Coating material 17 is typically a photoresist polymer. The spread of coating material 17 is dependent upon a number of factors including temperature of the wafer 1, temperature of coating material 17, speed of rotation, the viscosity of coating material 17. Excess coating material 17 is ejected from edge 5 during the rotation or wraps around to edge 5 and bottom surface 7. However, as shown in FIG. 2 coating layer 19 of coating material 17 typically has edge bead 21 proximate to outer edge 5 of wafer 1. Edge bead 21 may also extend to cover outer edge 5 and the area of bottom surface 7 which is proximate to outer edge 5.

The edge bead is removed from a substrate with an edge bead, whether or not the substrate was prepared as illustrated in FIG. 1 and described above, by application of an impinging stream. Preferably, the edge bead material is sufficiently removed from the proximity of the edge to expose the top 3, outer edge 5 and underside 7 of the substrate. In one embodiment, as shown in FIG. 2, an air knife 23 is positioned to direct a stream 25 of a nondissolving medium to impinge the edge bead 21 and outer edge 5 of wafer 1. Although this embodiment shows use of an air knife, any means of generating a directed high pressure stream or column of the non-dissolving medium may be used, such as a nozzle.

Air knife 23 typically includes a plurality of nozzles through which the non-dissolving medium is forced and which are aligned towards edge bead 21. Typically, the non-dissolving medium is forced through these nozzles at a high pressure. The non-dissolving medium may be any material that may be forced into a high-pressure stream and which is not a solvent for coating material 17. The non-dissolving medium may be a gas, for example clean dry air, noble gas or nitrogen. In other preferred embodiments, the non-dissolving medium is a solid/gas aerosol. Usable aerosols are known in the art, and preferably are argon or carbon dioxide aerosols.

A typical aerosol-using edge bead removal method involves cooling a gas, such as carbon dioxide or a mixture of argon and nitrogen, to near the liquefication point of the gas and spraying the cooled mixed gas through a nozzle into a low pressured chamber such that a part of the mixed gas forms solid particles. The solid particles as an aerosol in liquid and gas states collide with the edge bead, thereby removing the material of the edge bead. Aerosols and methods and nozzles for producing them, are further described in U.S. Pat. Nos. 5,062,898; 5,294,261; 5,512,106; 5,931,721; 5,810,942; and 5,853,962, all of which are incorporated herein by reference.

U.S. Pat. No. 5,062,898, discloses forming an aerosol containing argon solid particles by expanding a pressurized gaseous argon-containing stream, and removing particles or film on a surface of a specimen using the formed aerosol. Also, it is disclosed in the patent that a mixed gas containing argon gas is cooled to near the liquefaction point at a fixed pressure range of 20 psi to 680 psi prior to the expanding.

U.S. Pat. No. 5,294,261, further describes the use of argon with nitrogen-containing solid particles as well as an aerosol containing argon-containing solid particles as cleaning source.

U.S. Pat. No. 5,512,106, discloses previously cooling a mixture gas containing argon gas prior to supplying the mixture gas to a nozzle, and that the mixture gas supplied to the nozzle through the pre-cooling contains liquid drops of argon. The mixture gas containing previously cooled argon liquid drops is injected into an low pressured environment through the nozzle to thereby form a fluid containing argon solid drops which are created through adiabatic expansion and the fluid is then sprayed to a surface of a specimen for the cleaning. U.S. Pat. No. 5,931,721, describes an apparatus for performing the cleaning method provided in the aforesaid U.S. Pat. No. 5,512,106.

U.S. Pat. No. 5,810,942, describes a hydrodynamic structured chamber for spraying aerosol on a surface of a specimen for the cleaning and allowing both of aerosol and objects such as particles as removed to be easily extracted.

U.S. Pat. No. 5,853,962, discloses a method injecting a high pressured liquefied $CO_2$ through a nozzle, thereby transforming the liquefied $CO_2$ into soft solid $CO_2$, and then spraying the solid $CO_2$ on a surface of a specimen, thereby removing photoresist of organic material.

Figure 3:
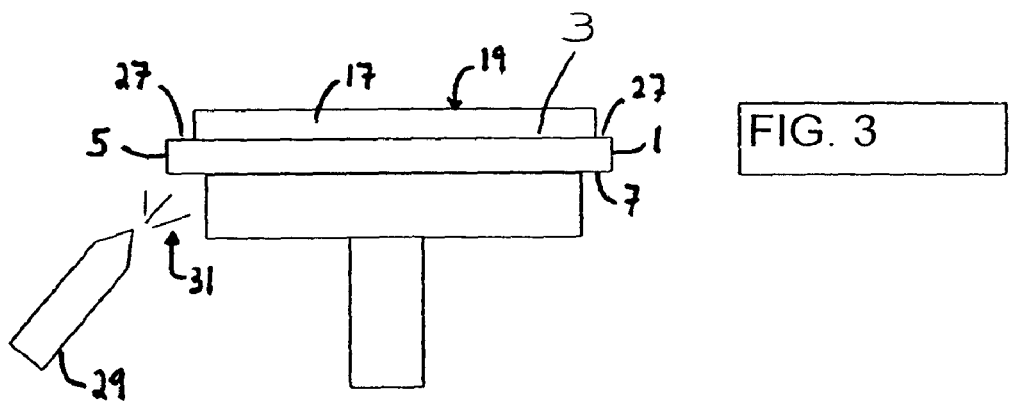
FIG. 3 shows a side view of a process step for cleaning off the edge bead residue.

As shown in FIG. 3, the stream of non-dissolving medium 25 edge bead 21 from the proximity of outer edge 5 of wafer 1. Removal of edge bead 21 can be, and perferably is, to such an extent that an area 27 on upper surface 3 of wafer 1 adjacent to outer edge 5 may be exposed.

Optionally, residue remaining after the removal of edge bead 21 may be removed by a wet cleaning process. One suitable wet cleaning method is disclosed in U.S. Pat. No. 6,255,228 B 1, incorporated herein by reference. In this method, contaminants are removed by applying a cleaning solution to the periphery and preferably the exposed back side 7 of the wafer 1 after the edge bead 21 has been removed. A nozzle 29 ejects a cleaning solution 31 onto the bottom 7 and outer edge 5 of wafer 1. Cleaning solution 31 wicks up around outer edge 5 and onto exposed section 27 to dissolve or wash away any residual particles. The cleaning solution may be water or may by formulated to react chemically with the unwanted coating material residue to form a compound that may be ejected from the periphery of the spinning wafer.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of non-chemically removing an edge bead of a material layer from a semiconductor substrate having opposing first and second surfaces and an outer edge surface therebetween, said material layer and the edge bead overlying and situated on the first surface of the semiconductor substrate, said edge bead situated proximate to the outer edge surface, the method comprising:
    while spinning the semiconductor substrate, non-chemically removing said edge bead without applying a liquid solvent by contacting said edge bead of the material layer with a stream consisting of a non-dissolving, non-aerosol gas medium under pressure directed toward said edge bead to impinge upon and non-chemically remove said edge bead.

2. The method of claim 1, wherein the material layer comprises a photoresist material.

3. The method of claim 1, wherein the material layer comprises a polymeric material.

4. A method of non-chemically removing an edge bead of a material layer from a semiconductor substrate having opposing first and second surfaces and an outer edge surface therebetween, said material layer and the edge bead overlying and situated on the first surface of the semiconductor substrate, said edge bead situated proximate to the outer edge surface, the method, comprising:
    while spinning the semiconductor substrate, non-chemically removing said edge bead without applying a liquid solvent by contacting said edge bead of the material layer with a stream consisting of a non-dissolving, non-aerosol gas medium under pressure directed toward said edge bead to impinge and non-chemically remove said edge bead, wherein the gas medium is a gas selected from the group consisting of air, a noble gas and nitrogen gas.

5. A method of non-chemically removing an edge bead of a material layer from a semiconductor substrate having opposing first and second surfaces and an outer edge surface therebetween, said material layer and the edge bead overlying and situated on the first surface of the semiconductor substrate and said edge bead situated proximate to the outer edge, the method comprising:
    while spinning the semiconductor substrate, non-chemically removing said edge bead without applying a liquid solvent by contacting said edge bead of the material layer with a stream consisting of a non-dissolving, non-aerosol gas under pressure directed toward said edge bead to impinge upon and non-chemically remove said edge bead.

6. A method of non-chemically removing an edge bead of a material layer from a semiconductor substrate having opposing first and second surfaces and an outer edge surface therebetween, said material layer and the edge bead overlying and situated on the first surface of the semiconductor substrate, said edge bead situated proximate to the outer edge, the method comprising:
    while spinning the semiconductor substrate, non-chemically removing said edge bead without applying a liquid solvent by contacting said edge bead of the material layer with a stream consisting of a non-dissolving, non-aerosol gas medium under pressure directed toward said edge bead to impinge upon and non-chemically remove said edge bead and expose the first surface of the semiconductor substrate.

7. A method of non-chemically removing an edge bead of a material layer from a semiconductor substrate having opposing first and second surfaces and an outer edge surface therebetween, said material layer and the edge bead overlying and situated on the first surface of the semiconductor substrate, said edge bead situated proximate to the outer edge, the method comprising:
    while spinning the semiconductor substrate, non-chemically removing said edge bead without applying a liquid solvent by contacting said edge bead of the material layer with a stream consisting of a non-dissolving, non-aerosol gas medium under pressure directed toward said edge bead to impinge upon and non-chemically remove said edge bead and expose said first surface and outer edge of the semiconductor substrate.

8. A method of non-chemically removing an edge bead of a material layer from a semiconductor substrate having opposing first and second surfaces and an outer edge surface therebetween, said material layer and the edge bead overlying and situated on the first surface of the semiconductor substrate, said edge bead situated proximate to the outer edge, the method comprising:
    while spinning the semiconductor substrate, non-chemically removing said edge bead without applying a liquid solvent by contacting said edge bead of the material layer with a stream consisting of a non-dissolving, non-aerosol gas medium under pressure directed toward said edge bead to impinge upon and non-chemically remove material from said edge bead.

9. A method of non-chemically removing a portion of a material layer overlying and situated on a first surface of a semiconductor substrate having opposing first and second surfaces and an outer edge surface therebetween, comprising:
    while spinning the semiconductor substrate, non-chemically removing said portion of the material layer without applying a liquid solvent by applying a stream consisting of a non-dissolving, non-aerosol gas medium under pressure directed toward the material layer proximate to said outer edge surface of the substrate to impinge upon said material layer and non-chemically remove a thickness of said material layer.

10. The method of claim 9, wherein the gas medium is a gas selected from the group consisting of air, a noble gas and nitrogen gas.

11. A method of non-chemically removing a portion of a material layer overlying and situated on a surface of a semiconductor substrate and proximate to an edge surface of the semiconductor substrate, comprising:
    while spinning the semiconductor substrate, non-chemically removing said portion of the material layer without applying a liquid solvent by applying a stream consisting of a non-dissolving, non-aerosol gas medium under pressure directed toward the material layer to impinge upon said material layer and non-chemically remove a thickness of said material layer.

12. A method of non-chemically removing an undesired thickness of a material layer overlying and situated on a surface and proximate to an outer edge surface of a semiconductor substrate having opposing first and second surfaces and said outer edge surface therebetween, the method comprising:

while spinning the semiconductor substrate, non-chemically removing said thickness of said material layer without applying a liquid solvent by contacting the material layer with a stream consisting of a non-dissolving, non-aerosol gas medium under pressure directed toward said material layer to impinge upon said material layer and non-chemically remove said thickness of the material layer.

13. A method of non-chemically removing a thickness of an edge bead of a material layer overlying and situated on a first surface and proximate to an outer edge surface of a semiconductor substrate having opposing first and second surfaces and said outer edge surface therebetween, the method comprising:

while spinning the semiconductor substrate, non-chemically removing said thickness of said edge bead without applying a liquid solvent by applying a stream consisting of a non-dissolving, non-aerosol gas medium under pressure directed toward said edge bead to impinge upon the edge bead to non-chemically remove said thickness of said edge bead.

14. A method of non-chemically removing an edge bead of a material layer overlying and situated on a surface of a semiconductor substrate, the edge bead on said surface and proximate to an outer edge surface of the semiconductor substrate, the method comprising:

while spinning the semiconductor substrate, non-chemically removing said edge bead without applying a liquid solvent by contacting said edge bead of the material layer with a stream consisting of a non-dissolving, non-aerosol gas medium under pressure directed toward said edge bead to impinge upon and non-chemically remove said edge bead and expose the substrate; and applying a cleaning solution to remove residue from the semiconductor substrate.

15. The method of claim 14, wherein the cleaning solution is chemically reactive with said residue.

16. A method of non-chemically removing an edge bead of a material layer overlying and situated on a surface of a semiconductor substrate, the edge bead overlying and on said surface and proximate to an outer edge surface of the semiconductor substrate, the method comprising:

while spinning the semiconductor substrate, non-chemically removing said edge bead without applying a liquid solvent by contacting said edge bead of the material layer with a stream consisting of a non-dissolving, non-aerosol gas medium under pressure directed toward said edge bead to impinge upon and non-chemically remove said edge bead and expose the substrate; and applying a wet cleaning to remove residue from the semiconductor substrate.

17. A method of non-chemically removing an edge bead of a material layer overlying and situated on a surface of a semiconductor substrate, the edge bead on said surface and proximate to an outer edge surface of the semiconductor substrate, the method comprising:

while spinning the semiconductor substrate, non-chemically removing said edge bead without applying a liquid solvent by contacting said edge bead of the material layer with a stream consisting of a non-dissolving, non-aerosol gas medium under pressure directed toward said edge bead to impinge upon and non-chemically remove said edge bead and expose the substrate; and applying a cleaning solution to remove residue from the exposed semiconductor substrate and a backside of the semiconductor substrate.

18. A method of non-chemically removing a portion of a material layer overlying and situated on a first surface of a semiconductor substrate, comprising:

while spinning the semiconductor substrate, non-chemically removing said portion of the material layer without applying a liquid solvent by applying a stream consisting of a non-dissolving, non-aerosol gas medium under pressure directed toward said material layer proximate to an outer edge surface of the substrate to impinge upon said material layer and non-chemically remove a thickness of said material layer and expose the first surface of the substrate; and applying a cleaning solution to remove residue from the exposed first surface of the semiconductor substrate and an opposing second surface of the semiconductor substrate.

19. A method of non-chemically removing a thickness of an edge bead of a material layer overlying and situated on a surface of a semiconductor substrate proximal to an outer edge of the semiconductor substrate, comprising:

while spinning the semiconductor substrate, non-chemically removing said thickness of said edge bead without applying a liquid solvent by applying a stream consisting of a non-dissolving, non-aerosol gas medium under pressure directed toward said edge bead to impinge upon the edge bead to non-chemically remove said thickness of said edge bead and expose the semiconductor substrate; and applying a cleaning solution to remove residue from the exposed semiconductor substrate and a backside of the semiconductor substrate.

* * * * *